US011679510B2

(12) United States Patent
Yu et al.

(10) Patent No.: US 11,679,510 B2
(45) Date of Patent: Jun. 20, 2023

(54) PHOTORESIST BOTTLE REPLACEMENT SYSTEM (71) Applicant: Taiwan Semiconductor Manufacturing Co., Ltd., Hsinchu (TW)

(72) Inventors: Oliver Yu, Hsinchu (TW); Huei-Chi Chiu, Tainan (TW); Shi-Ming Wang, Tainan (TW); Li-Jen Wu, Tainan (TW); Yu Kai Chen, Kaohsiung (TW); Sharon Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 129 days.

(21) Appl. No.: 17/113,371

(22) Filed: Dec. 7, 2020

(65) Prior Publication Data

US 2021/0086368 A1 Mar. 25, 2021

Related U.S. Application Data (62) Division of application No. 16/034,886, filed on Jul. 13, 2018, now Pat. No. 10,857,676.

(51) Int. Cl.
*B25J 11/00* (2006.01)
*G03F 7/00* (2006.01)
(Continued)

(52) U.S. Cl.
CPC .......... *B25J 11/005* (2013.01); *B25J 13/006* (2013.01); *B25J 15/08* (2013.01); *G03F 7/003* (2013.01);
(Continued)

(58) Field of Classification Search
CPC ........ B25J 9/0093; B25J 11/005; B60P 3/055; B67D 1/0839; B67D 1/0888; B67D 1/1245
(Continued)

(56) References Cited

U.S. PATENT DOCUMENTS 6,868,986 B1 * 3/2005 Arnold ................ B67D 1/1247
222/66
8,140,184 B2 3/2012 Chen et al.
(Continued)

FOREIGN PATENT DOCUMENTS

TW 200901054 A 1/2009

OTHER PUBLICATIONS

Office Action dated Jul. 27, 2020 for Taiwan Intellectual Property Office Appl. No. 108124415, 11 pages.

*Primary Examiner* — Christopher M Koehler
(74) *Attorney, Agent, or Firm* — Sterne, Kessler, Goldstein & Fox P.L.L.C.

(57) ABSTRACT

The present disclosure describes a method for replacing a photoresist (PR) bottle using a vehicle. An exemplary vehicle includes a processor configured to receive a request signal to replace a first PR bottle. The processor is also configured to transmit an order based on the request signal. The vehicle also includes a plurality of wheels configured to move the vehicle from the first location to a second location, and from the second location to the first location. The vehicle further includes a robotic arm configured to load, at the first location, the first PR bottle into a first container; load a second PR bottle in a second container; remove a cap from the second PR bottle and a socket from the first PR bottle; couple the socket of the first PR bottle to the second PR bottle; and unload the second PR bottle from the second container.

20 Claims, 7 Drawing Sheets (51) Int. Cl.
   *B25J 15/08*    (2006.01)
   *B25J 13/00*    (2006.01)
   *G05D 1/02*     (2020.01)
(52) U.S. Cl.
   CPC ... *G05D 1/0212* (2013.01); *G05D 2201/0216* (2013.01)
(58) Field of Classification Search
   USPC .......... 414/222.08, 222.07, 222.13, 225.01
   See application file for complete search history.

(56) References Cited

U.S. PATENT DOCUMENTS

| | | | | |
|---|---|---|---|---|
| 8,393,847 | B1* | 3/2013 | Mecklenburg | B60P 1/5433 |
| | | | | 108/142 |
| 8,875,866 | B2* | 11/2014 | Sebe | B65G 47/61 |
| | | | | 414/222.11 |
| 2003/0017034 | A1* | 1/2003 | Davis | H01L 21/67173 |
| | | | | 414/217 |
| 2008/0307904 | A1* | 12/2008 | Pressman | B01L 3/502 |
| | | | | 414/222.07 |
| 2010/0061831 | A1* | 3/2010 | Nishino | B65G 47/842 |
| | | | | 294/91 |
| 2010/0071513 | A1* | 3/2010 | Wang | B67B 7/02 |
| | | | | 81/3.37 |
| 2010/0290872 | A1* | 11/2010 | Bonora | H01L 21/67769 |
| | | | | 257/E21.001 |
| 2014/0334905 | A1* | 11/2014 | Spinazze | B60P 3/055 |
| | | | | 280/400 |
| 2017/0233236 | A1* | 8/2017 | Shen | B67D 1/0839 |
| | | | | 222/67 |
| 2018/0111747 | A1* | 4/2018 | Mo | B05B 9/0811 |
| 2018/0265297 | A1* | 9/2018 | Nakano | B66F 9/06 |
| 2019/0039792 | A1* | 2/2019 | Truskett | B65D 51/1683 |
| 2019/0339792 | A1 | 2/2019 | Truskett et al. | |

* cited by examiner

PHOTORESIST BOTTLE REPLACEMENT SYSTEM

CROSS-REFERENCE TO RELATED APPLICATION

This application is a divisional of U.S. Non-provisional patent application Ser. No. 16/034,886, titled "Photoresist Bottle Replacement System," filed on Jul. 13, 2018, which is incorporated herein by reference in its entirety.

BACKGROUND

Photoresist (PR) is a crucial element in semiconductor industry. PR is used in various stages of semiconductor fabrication process for forming patterns on wafers. PR bottles (e.g., bottles that contains PR for semiconductor fabrication usage) have been manually replaced for PR refill/replacement. However, manual replacement of PR bottles can be time-consuming and costly, and can be susceptible to human mistakes and damages.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor fabrication, PR is a crucial element for forming various patterns/features. PR is kept in PR bottles, which are distributed at different locations of a fabrication facility. When a PR bottle is low in PR or is empty, the PR bottles can be manually replaced/refilled. The replacement/refill of PR bottles can include the manually transporting the empty PR bottles to a specific location (e.g., warehouse) to refill/replace the PR bottles. The transport and refill/replacement of PR bottles can be susceptible to PR bottle damage, PR spill, and human error; this process can also be time-consuming and costly.

Embodiments of the present disclosure describe a system and a method to automatically transport PR bottles and replace an empty PR bottle with a filled PR bottle. The system includes a central controller, a vehicle, and a plurality of receiving devices. The central controller communicates with and controls the operation of the vehicle and the receiving devices. The vehicle, being controlled by the central controller, can automatically transport an empty PR bottle from a fabrication location to a location for PR bottle replacement (e.g., warehouse), replace the cap of a full PR bottle with the socket of the empty PR bottle, and transport the full PR bottle back to the fabrication location. A benefit, among others, includes that the transport and replacement/refill of PR bottles can be automated so that the transport and replacement/refill of PR bottles are less susceptible to uncertainties/errors caused by human operations. Being protected by a container and transported by the vehicle, the PR bottles are less susceptible to damage/spill/leakage, and the transport can be less time-consuming. Further, the PR bottles can be loaded and unloaded to the vehicle using automated means with improved stability, reducing the chances of PR bottle damages/spill/leakage. Further, the socket replacement process is more reliable and predictable by using a robotic arm. Less labor is thus needed for the loading, transport, and replacement of PR bottles.

Figure 1:
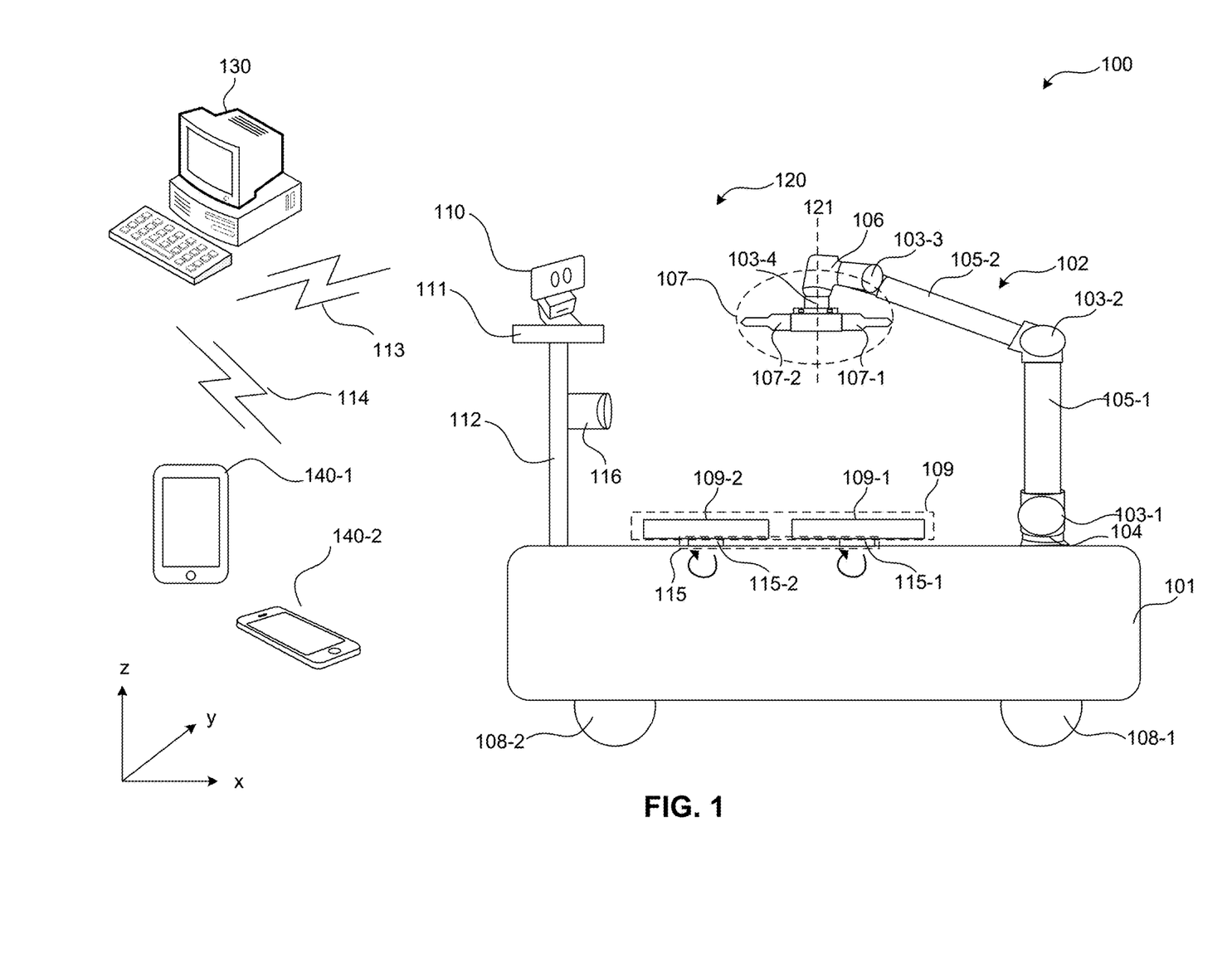
FIG. 1 illustrates an exemplary PR replacement system, according to some embodiments.

FIG. 1 illustrates an exemplary system 100 that can automatically transport and replace PR bottles, according to some embodiments. System 100 can include a vehicle 120, a central controller 130, receiving devices 140-1 and 140-2, and communication networks 113 and 114. Central controller 130 can communicate with and control vehicle 120 to move to a first location (e.g., a location where an empty PR bottle is located), load the empty PR bottle onto vehicle 120, transport the loaded empty PR bottle to a second location (e.g., a location where a full PR bottle is located), load the full PR bottle onto vehicle 120, take off the cap from the full PR bottle and the socket from the empty PR bottle, and place the socket onto the full PR bottle, according to some embodiments. Central controller 130 can also communicate with and control vehicle 120 to unload the empty PR bottle (e.g., at the second location), transport the full PR bottle back to the first location, and unload the full PR bottle, according to some embodiments. For ease of description, an "empty PR bottle" can stand for any PR bottle that is to be replaced, a "full PR bottle" can stand for any other PR bottle for replacing the empty PR bottle, and a "socket" can stand for the cap/socket (e.g., of the empty PR bottle) that a hose is fixed within. The hose can be a flexible tube, going through the socket, for conveying PR from the PR bottle to, e.g., a fabrication platform. Central controller 130 can be located at any suitable location. For example, central controller 130 can be inside or outside the fabrication facility, or can be installed on one or more vehicles 120.

In some embodiments, vehicle 120 includes a vehicle body 101, a plurality of wheels 108, a robotic arm 102, a plurality of rotatable stages 109, a plurality of rotatable bases 115 connecting the rotatable stages 109 and vehicle body 101, a supporting pillar 112, an identification (ID) sensing device 116, a supporting stage 111, and an imaging device 110. Vehicle 120 can be powered by power of various forms, such as DC current, AC current, battery, etc. For illustrative purposes, two wheels 108-1 and 108-2, two rotatable stages 109-1 and 109-2, and two rotatable bases 115-1 and 115-2 are shown. The plurality of wheels 108 can be designed to rotate and carry vehicle body 101 to different locations in the fabrication facility. The plurality of rotatable stages 109 can maintain stable in the same horizontal plane (e.g., the x-y plane). In some embodiments, the plurality of rotatable stages 109 are horizontally aligned in the same horizontal plane. For example, rotatable base 115-1 and rotatable stage 109-1 can be the same as or similar to rotatable base 115-2 and rotatable stage 109-2, respectively, and the top surfaces of rotatable stages 109-1 and 109-2 can be horizontally aligned in the horizontal plane (e.g., having the same elevation from the ground). The plurality of rotatable stages 109 can fix the horizontal and vertical positions of the PR bottles placed thereon and ensure that PR bottles are at least substantially at a same elevation from the ground. The PR bottles can be located within the range in which imaging device 110 captures images of the PR bottles with sufficient resolution for further processing and recognition. Robotic arm 120 can rotate to clamp onto caps/sockets without touching the PR bottles. In some embodiments, rotatable bases 115-1 and 115-2 can each be connected to a motor that can drive rotatable stages 109-1 and 109-2, respectively, to rotate clockwise and/or counter-clockwise in the same horizontal plane so that when robotic arm 102 clamps onto the cap/socket of a PR bottle placed on a rotatable stage 109, a corresponding rotatable base 115 can drive rotatable stage 109 to rotate clockwise or counter-clockwise for robotic arm 102 to turn the cap/socket more easily.

ID sensing device 116 can include any suitable devices that can detect and verify that the correct PR bottles are placed on rotatable stages 109. For example, the PR bottles and/or the containers (that hold the PR bottles) can include radio frequency ID (RFID) tags. ID sensing device 116 can include a (RFID) reader. ID sensing device 116 can detect a full PR bottle placed on rotatable stage 109 matches an empty PR bottle so that cap/socket replacement can be operated between the two PR bottles. The full PR bottle that matches the empty PR bottle can be any suitable PR bottle that is can replace the empty PR bottle. The full PR bottle can be filled with the same type of or a different type of PR as of the empty PR bottle. The full PR bottle can have the same dimension as or different dimensions than the empty PR bottle. In some embodiments, system 100 (e.g., central controller 130, vehicle 120, and/or receiving devices 140) records a PR bottle and any other PR bottle (e.g., matching PR bottles) that can replace the PR bottle.

Imaging device 110 can be mounted/placed on supporting stage 111 to record and monitor that the hose and socket of the empty PR bottle are properly placed in the matching full PR bottle, according to some embodiments. Imaging device 110 can be any suitable device that can record images for a pattern recognition and/or an image recognition process. For example, one end of the hose can be connected with a weight (e.g., an object that is sufficiently heavy to immerse into the PR) that has a detectable shape/size (e.g., a shape/size that can be detected using a recognition function) so that when the weight sinks into the PR, the end of the hose that is connected with the weight can also immerse into the PR to allow sufficient PR to be drawn for fabrication operations. Meanwhile, imaging device 110 can record the position of the weight and an image recognition can be performed based on the recorded real-time position of the weight to ensure the end of the hose, with the weight, is properly positioned under the surface of the PR. In some embodiments, with the weight, the hose can be straightened and facing substantially upwardly. Imaging device 110 can also record the real-time positions of the caps and sockets, and image recognitions can be performed to ensure the caps and the sockets are properly taken off or placed on the suitable PR bottles. In some embodiments, imaging device 110 can include a dual charged-coupled device (CCD) camera and the image recognition can include a three-dimensional (3D) positioning process. For example, system 100 (e.g., vehicle 120, central controller 130, and/or receiving devices 140) can recognize the position of the weight and/or compare the position (e.g., along the x-y plane and the z-axis) with a stored position to determine whether the weight and the socket have been placed properly (e.g., at the bottom of the PR and/or under the surface of the PR).

Supporting pillar 112 can be any suitable supporting structure with sufficient stiffness and strength to provide suitable positions/angles for ID sensing device 116 and imaging device 110. Supporting stage 111 can be any suitable structure that can stably position imaging device 110 thereon. In some embodiments, imaging device 110 moves according to the movement of supporting stage 111. In some embodiments, ID sensing device 116 is mounted along supporting pillar 112 and its position along a vertical axis (e.g., the z-axis) can be adjusted automatically/manually. In some embodiments, supporting pillar 112 can rotate clockwise and/or counter-clockwise to adjust the position of ID sensing device 116. Accordingly, the position of ID sensing device 116 can be adjusted (e.g., vertically and/or horizontally) so that ID sensing device 116 can be placed at a desired angle/height to more accurately detect and verify the identification (e.g., ID numbers and/or RFIDs) of the PR bottles placed on rotatable stages 109. In some embodiments, supporting pillar 112 can drive supporting stage 111 to rotate clockwise/counter-clockwise so that the orientation of imaging device 110 can be adjusted and imaging device 110 can face desired PR bottles (e.g., the PR bottles of which the caps/sockets are being replaced). In some embodiments, supporting pillar 112 can also extend along the vertical axis (e.g., the z-axis) so that the elevation of imaging device 110 can be adjusted to allow imaging device 110 to record features of different heights. For example, PR bottles of different height can be placed on rotatable stages 109-1 and 109-2, and the positions and/or orientations of imaging device 110 can be automatically adjusted to monitor the replacement of the bottles' caps/sockets. That is, the positions and/or orientations of imaging device 110 can be adjusted based on the PR bottles placed on rotatable stages 109.

Robotic arm 102 can include an arm base 104, a first connecting portion 103-1, a first arm portion 105-1, a second connecting portion 103-2, a second arm portion 105-2, a third connecting portion 103-3, an arm top portion 106, a fourth connecting portion 103-4, and a gripping portion 107. Gripping portion 107 can include a plurality of clamping structures rotationally connected together.

Arm base 104 can be fixed on vehicle body 101 to provide support for structures/objects attached to arm base 104. Arm base 104 can sustain a force/weight applied on robotic arm 102. As shown in FIG. 1, first arm portion 105-1 can be connected to arm base 104 through first connecting portion 103-1, second arm portion 105-2 can be connected to first arm portion 105-1 through second connecting portion 103-2, arm top portion 106 can be connected to second arm portion 105-2 through third connecting portion 103-3, and gripping portion 107 can be connected to arm top portion 106 through fourth connecting portion 103-4. First arm portion 105-1 and second arm portion 105-2 can be of any suitable shape that can move in various directions and can be made of a suitable material of sufficient stiffness and strength. In some embodiments, first arm portion 105-1 and second arm portion 105-2 each has a pillar shape and includes a metal material (e.g., stainless steel). First connecting portion 103-1, second connecting portion 103-2, and third connecting portion 103-3 can jointly connect arm portions on both sides and allow connected arm portions to move horizontally and/or vertically (e.g., x- and z-directions, respectively). Arm top portion 106 can be of any suitable shape that can be connected to and can suspend gripping portion 107 so the clamping structures of gripping portion 107 can be aligned with one another in a same plane for clamping onto caps/sockets. In some embodiments, arm top portion 106 has an "L" shape, with one end connected to third connecting portion 103-3 and the other end connected to fourth connecting portion 103-4. Clamping structures of gripping portion 107 can thus be suspended to fourth connecting portion 103-4 and can rotate in a horizontal plane (e.g., x-plane). In some embodiments, connecting portions 103-1 to 103-4 each include pivot connections and are made of materials with sufficient stiffness and strength such as metal (e.g., stainless steel).

Gripping portion 107 can include a plurality of clamping structures rotationally connected together. For illustrative purposes, two clamping structures 107-1 and 107-2 are shown. In the present disclosure, the term "rotationally connected" can refer to one end of each clamping structure being mounted together to allow the other ends of the clamping structures to rotate and grip on the cap/socket of PR bottles. The rotationally connected clamping structures can be suspended from fourth connecting portion 103-4 and can rotate about a vertical central line 121 (e.g., along the z-axis). In some embodiments, the rotationally connected clamping structures are positioned in a same horizontal plane and can rotate in the horizontal plane to grip on desired caps/sockets. In some embodiments, fourth connecting portion 103-4 includes a spring structure that allows gripping portion 107 to extend or withdraw vertically (e.g., adjust its position along the z-axis) when clamping caps/sockets. The position of a clamping structure can thus be adjusted horizontally and vertically. Gripping portion 107 can be made of suitable materials with sufficient stiffness and strength to sustain reaction force applied by clamped objects. In some embodiments, gripping portion 107 can be made of metal (e.g., stainless steel) and/or reinforced plastics.

Vehicle 120 can also include a control unit (not shown) that controls various operations of vehicle 120. For example, the control unit can control the communication between vehicle 120 and central controller 130, the automated loading and unloading of PR bottles, the moving of robotic arms 102, the rotation of rotatable bases 115, the detection of ID signals by ID sensing device 116, the transmission and processing of the sensed ID signals, the recording of cap/socket replacement by imaging device 110, and/or the transmission and processing of the recorded images. The control unit can include suitable software and hardware, such as computer programs stored in a memory, and a processor and related circuitry, to execute various operations. In some embodiments, vehicle 120 stores a map of the fabrication facility and is installed with suitable positioning systems, so that vehicle 120 can move in the fabrication facility following designated routes. For example, the control unit of vehicle 120 can include a global positioning system (GPS) receiver, a receiving device/program with a Bluetooth-based indoor positioning system, and/or a receiving device/program with a WiFi-based indoor positioning system for navigating in the fabrication facility according to the indoor map. The fabrication facility can include corresponding devices for the indoor positioning system, such as Bluetooth beacons and/or WiFi access points distributed at various locations for the indoor positioning functions. The control unit can be arranged at any suitable position of vehicle 120. In some embodiments, the control unit is positioned in vehicle body 101.

Central controller 130 can include any suitable computer system that controls the overall operation of vehicle 120 and receiving devices 140. Receiving devices 140 (e.g., tablet 140-1 and cell phone 140-2) can include any suitable portable device and can be used for communication with central controller 130. In some embodiments, each receiving device 140 includes a processor and related circuitry for processing and responding to the notifications/commands transmitted by central controller 130. For example, central controller 130 can receive real-time data from vehicle 120 and transmit notifications including the real-time status of vehicle 120 to receiving device 140-1 and/or 140-2. Vehicle 120 can communicate with central controller 130 through communication network 113, and receiving devices 140 can communicate with central controller 130 through communication network 114. Communication networks 113 and 114 can each be a suitable wired or wireless communication means. In some embodiments, communication networks 113 and 114 include WiFi. Detail description of the computers/processors in vehicle 120, central controller 130, and receiving devices 140 are described below.

Figure 2A:
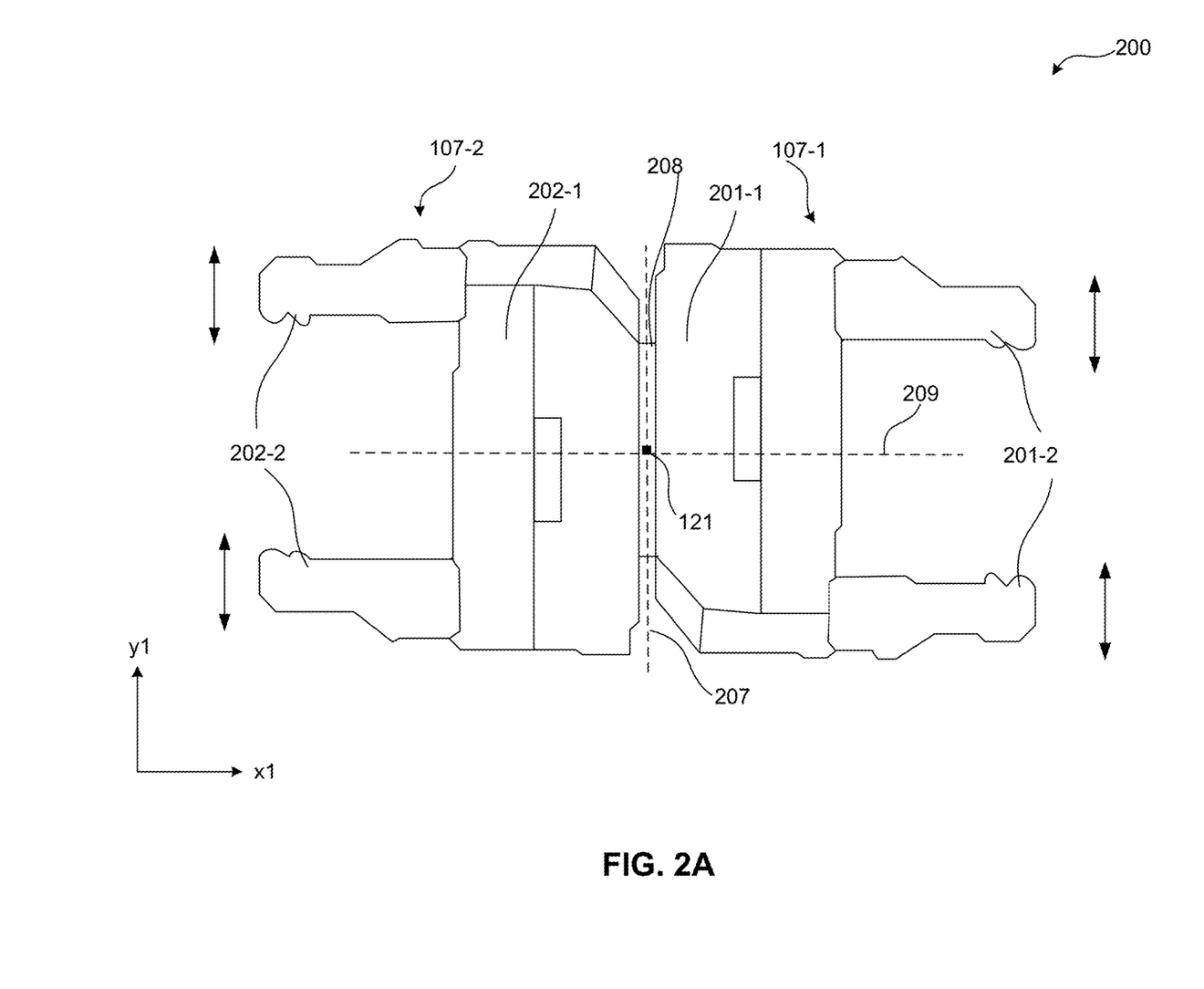
FIG. 2A illustrates a top view of an exemplary clamping structure, according to some embodiments.

FIG. 2A illustrates an overview 200 of an exemplary gripping portion, according to some embodiments. The gripping portion shown in FIG. 2A can be the same as or similar to gripping portion 107 illustrated in FIG. 1. In some embodiments, the gripping portion includes two clamping structures 107-1 and 107-2. The two clamping structures 107-1 and 107-2 can each include a clamp base (201-1 and 202-1) and a pair of clamps (201-2 and 202-2). A clamp base and its clamps can each be of any suitable shape for clamping caps/sockets of various sizes. In some embodiments, the clamps have the shape of prongs. In some embodiments, the clamp base and the clamps are made of suitable materials of sufficient stiffness and strength for gripping and moving clamped objects. For example, the clamp base and the clamps can be made of metal (e.g., stainless steel). The two clamping structures 107-1 and 107-2 can form a rigid connection at one end of the clamp bases. The two pairs of clamps 201-2 and 202-2, at the other end, can be exposed to point at opposite directions for clamping onto objects. For ease of description, FIG. 2A is illustrated in the x1-y1 plane, a plane formed by the connected clamping structures. The x1-axis is referred to as the longitudinal direction and the y1-axis is referred to as the lateral direction. For example purposes, the clamping structures are rigidly connected along the x1-axis.

In some embodiments, clamping structures 107-1 and 107-2 are connected through a hub structure 208 at one end. Hub structure 208 can include a suitable material with sufficient stiffness and strength to connect clamping structures 107-1 and 107-2 as one piece. Hub structure 208 can be connected to the arm top portion (e.g., 106 in FIG. 1) through fourth connecting portion (e.g., 103-4 in FIG. 1). In some embodiments, at least one of clamping structures 107-1 and 107-2 includes a connecting portion at one end of the clamp base opposite of the clamps for connecting the other clamping structure. In some embodiments, the two clamping structures 107-1 and 107-2 are welded together. In some embodiments, clamping structures 107-1 and 107-2 are similar or same clamping structures. In some embodiments, the gripping portion includes more than two clamping structures rigidly connected together, and the clamps can be pointed in various different directions.

Clamping structures 107-1 and 107-2 can rotate about vertical central line 121 of FIG. 1 (viewed as a dot along the vertical direction/z-axis at the center point of the gripping portion in the x1-y1 plane) in the x1-y1 plane so that a desired pair of clamps can face and approach the cap/socket to be operated on. In some embodiments, the two clamping structures 107-1 and 107-2 move/rotate as one piece along line 207 (of FIG. 2A), which lies across the center point of clamping structures 107-1 and 107-2 along the x1-axis. In some embodiments, the two clamping structures 107-1 and 107-2 move/rotate as one piece along line 209, which lies across the center point of clamping structures 107-1 and 107-2 along the y1-axis. In some embodiments, the center points of clamping structures 107-1 and 107-2 along the x1-axis and along the y1-axis each overlaps with vertical central line 121.

In some embodiments, clamping bases (e.g., 201-1 and 202-1) are rigidly connected together and clamps (e.g., 201-2 and 202-2) are movable laterally along the y1-direction (indicated by the double-headed arrows). The central controller (e.g., 130 in FIG. 1) and/or the vehicle (e.g., 120 in FIG. 1) can control the movement of clamps to widen or reduce the spacing between the two prongs so that the desired cap/socket can be placed in the spacing before the clamps contact the cap/socket.

Figure 2B:
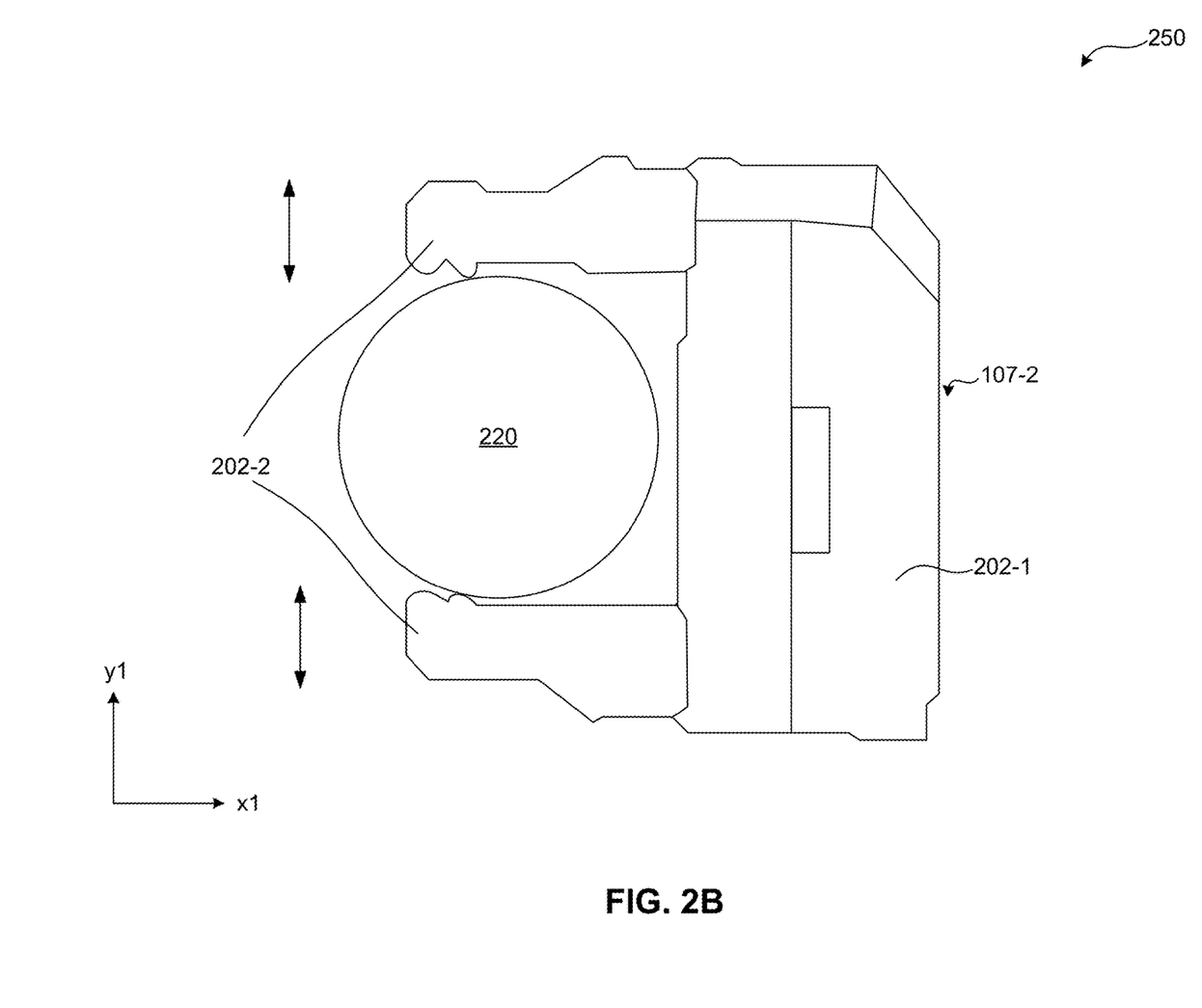
FIG. 2B illustrates a top view of an exemplary clamping structure in an operation of a PR replacement process, according to some embodiments.

FIG. 2B illustrates a top view 250 of clamping structure 107-2 clamping onto a cap/socket, according to some embodiments. Element 220 can represent a cap or a socket of a PR bottle. Cap/socket 220 can be of different sizes and clamps 202-2 can move along the y1-axis to adjust to the size of cap/socket 220. Accordingly, clamp structure 107-2 can contact and tightly fix/couple cap/socket 220 on the outer sidewall of cap/socket 220. Further, central controller and/or vehicle can control clamping structure 107-2 to rotate cap/socket 220 in the x1-y1 plane, and cap/socket 220 can be rotated on or off a PR bottle.

Figure 3A:
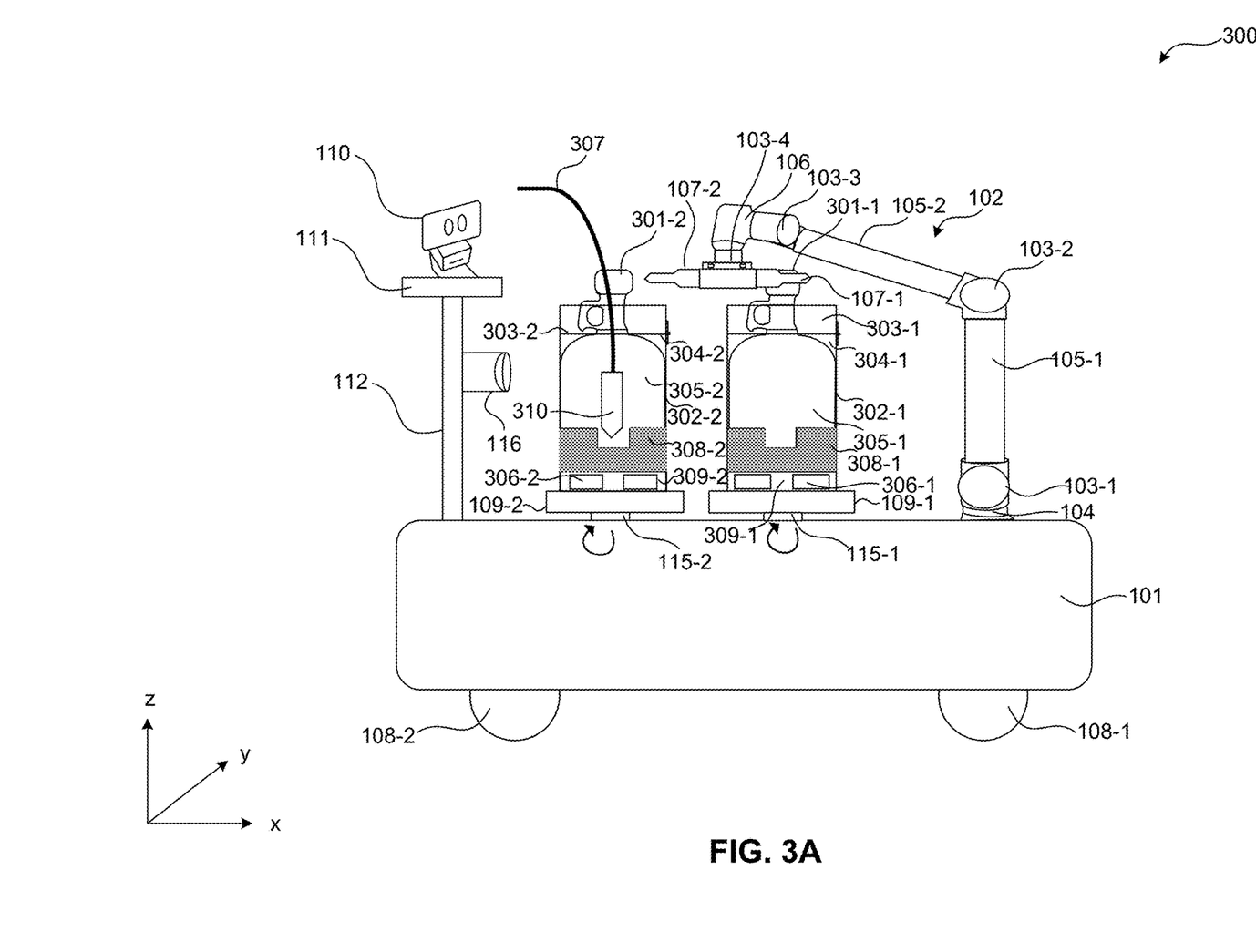
FIG. 3A illustrates an exemplary PR replacement system in an operation of a PR replacement process, according to some embodiments.
Figure 3B:
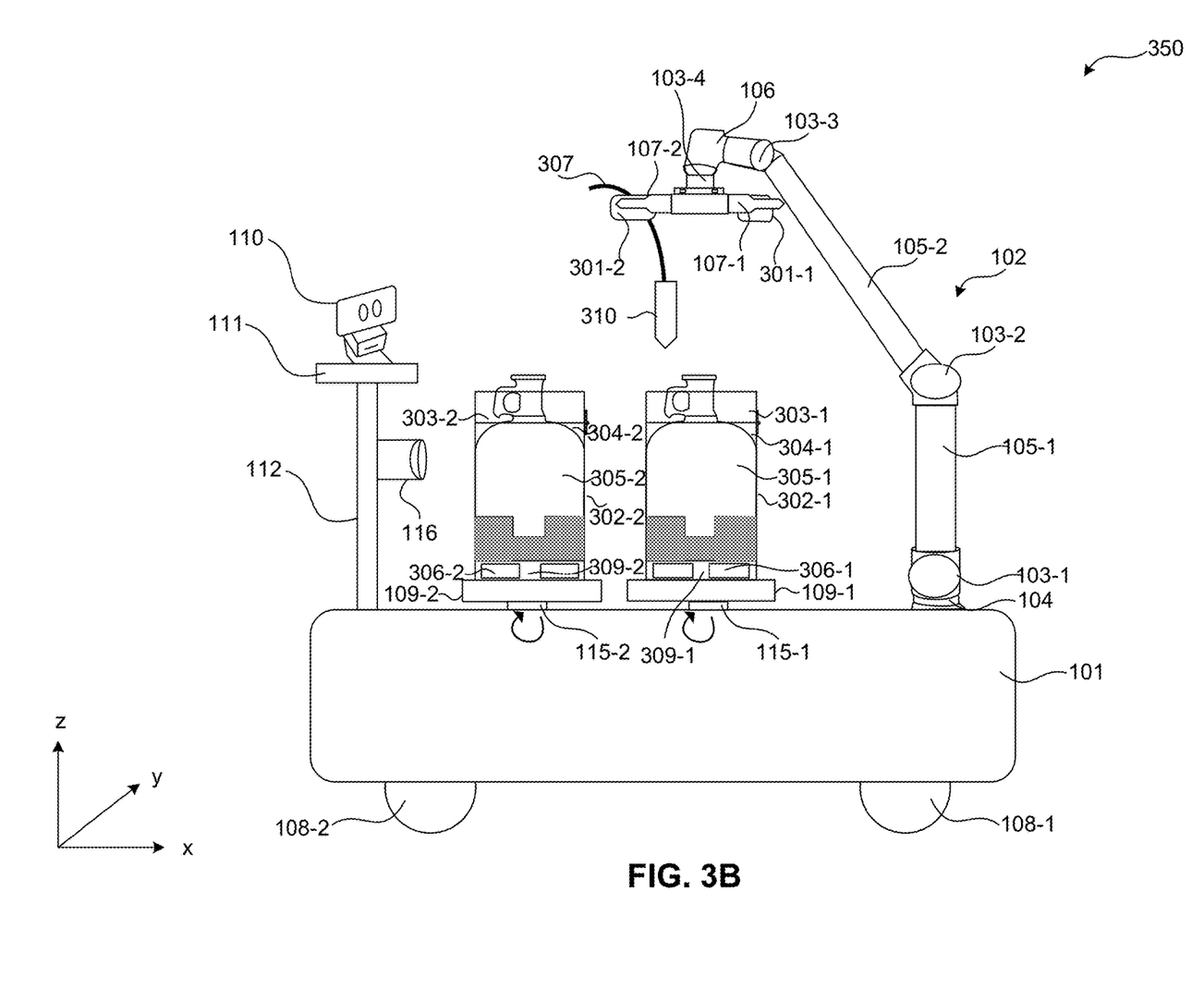
FIG. 3B illustrates an exemplary PR replacement system in another operation of a PR replacement process, according to some embodiments.

FIGS. 3A and 3B are illustrations 300 and 350 of an exemplary vehicle in an operation of replacing cap/socket of PR bottles, according to some embodiments. Compared to vehicle 120 illustrated in FIG. 1, the vehicle in FIGS. 3A and 3B each further includes two PR bottles (e.g., 305-1 and 305-2), each in a container 302, loaded on rotatable stages 109-1 and 109-2. In some embodiments, containers 302 are part of the system (e.g., system 100 shown in FIG. 1). For illustrative purposes, PR bottle 305-2 in container 302-2 and on rotatable stage 109-2 represents an empty PR bottle, and PR bottle 305-1 in container 302-1 and on rotatable stage 109-1 represents a full PR bottle. PR bottle 305-2 can include a socket 301-2 which has a hose 307 inserted through. A weight 310 can be attached to one end of hose 307 to allow hose to immerse in PR properly. PR bottle 305-1 can include a cap 301-1. As shown in FIGS. 3A and 3B, each PR bottle (e.g., 305-1 and 305-2) is placed in a respective container (e.g., 302-1 and 302-2), and the container is loaded on the respective rotatable stage (e.g., 109-1 and 109-2). Each container can include a lid (e.g., 303-1 and 303-2), a container body (e.g., 304-1 and 304-2), and a collision-preventing portion (e.g., 308-1 and 308-2). Each container can further include a carrier-insertion portion (e.g., 309-1 and 309-2) fixed/attached at the bottom of the container, where the carrier-insertion portion can include a plurality of insertion openings (e.g., 306-1 and 306-2). For illustrative purposes, two insertion openings are shown.

A PR bottle (e.g., 305-1 or 305-2) can be secured in the corresponding container (e.g., 302-1 or 302-2) during fabrication and PR can be drawn out of the PR bottle through hose 307. Lid (e.g., 303-1 or 303-2) can be maintained closed to secure the position and orientation of the PR bottle in the container, and collision-preventing portion (e.g., 308-1 or 308-2) can further buffer any impact caused by the PR bottle and avoid any collision between the PR bottle and parts of the container. When PR in PR bottle 305-2 is low, a signal can be transmitted to the central controller requesting a replacement of PR bottle 305-2. In some embodiments, the signal can include the location of PR bottle 305-2 (e.g., the first location), the time, the ID number of container 302-2/PR bottle 305-2, and the approximately percentage of the remaining PR. The request can also be manually transmitted (e.g., by a technician operating on the PR bottle 305-2) to a receiving device (e.g., same as or similar to receiving device 140 shown in FIG. 1) or automatically transmitted by container 302-2. In some embodiments, container 302-2 includes a PR detecting mechanism that can automatically detect the remaining PR in PR bottle 305-2, e.g., based on weight of PR bottle 305-2. In some embodiments, container 302-2 includes an integrated circuit (IC) that can communicate with the vehicle and/or the central controller.

When receiving the request, the central controller can transmit the vehicle to the location of PR bottle 305-2. The vehicle can follow the stored indoor map and choose a designated route to reach the location, according to some embodiments. In some embodiments, after PR bottle 305-2 is loaded onto rotatable stage 109-2, the central controller can be notified. In some embodiments, the vehicle can approach PR bottle 305-2 and determine an optimized distance between the vehicle and PR bottle 305-2, and robotic arm 102 can automatically insert clamping structures (e.g., 107-1 or 107-2) into insertion openings 306-2 to load/raise/lift container 302-2 onto rotatable stage 109-2, and the vehicle can transmit a vehicle status update to the central controller about the loading of PR bottle 305-2. In some embodiments, ID sensing device 116 detects the ID number of container 302-2 after it is placed on rotatable stage 109-2 and transmits a vehicle status update, including the ID number of container 302-2, to the central controller about the loading of PR bottle 305-2. The central controller can then verify the ID number of container 302-2 matches the request and send the vehicle to the location that PR bottle 305-1 is stored (e.g., the second location). In some embodiments, the vehicle includes, e.g., a command button and/or a keypad, in which a second location can be entered by pressing the command button and/or typing on the keypad. Further, the vehicle can communicate with the central controller to update the status of the vehicle, e.g., the loading of PR bottle 305-2 and the transporting of PR bottle 305-2 to the second location.

After the vehicle arrives at the second location, PR bottle 305-1 (e.g., full in PR and contained in container 302-1) can be loaded onto rotatable stage 109-1, in a similar manner (manual or automated loading) as described above. In some embodiments, PR bottles 305-1 and 305-2 are substantially fixed onto rotatable stages 109-1 and 109-2, respectively, to allow rotating of socket 301-2 and cap 301-1. For example, rotatable stages 109-1 and 109-2 can each include features/patterns (e.g., snaps and/or hooks) to limit the movement of containers 302-1 and 302-2. In another example, the friction between a rotatable stage (e.g., 109-1 or 109-2) and the corresponding bottom of carrier-insertion portion (e.g., 309-1 or 309-2) can be sufficiently large to effectively limit the movement and sliding of the corresponding container (e.g., 302-1 or 302-2). In some embodiments, ID sensing device 116 can verify the ID number of container 305-1 to ensure PR bottle 305-1 matches PR bottle 305-1. In some embodiments, when it is detected that PR bottle 305-1 is not a match to PR bottle 305-2, the central controller commands (e.g., transmits instructions to) the vehicle to unload container 302-1 and search for the matching PR bottle. In some embodiments, when no matching PR bottle is located, the vehicle notifies the central controller and the central controller transmits a notification to one or more receiving devices to request additional assistance (e.g., from a technician) to locate the matching PR bottle. In some embodiments, when no matching PR bottle is located, a status update can be transmitted to the central controller reporting the insufficient storage of the matching PR bottle, and the central controller automatically requests for ordering of additional matching PR. In some embodiments, the second location is a warehouse for storing empty and/or full PR bottles.

As shown in FIGS. 3A and 3B, the vehicle can first remove the cap from the full PR bottle (e.g., cap 301-1 from PR bottle 305-1) and then remove the socket from the empty PR bottle (e.g., socket 301-2 from PR bottle 305-2), to avoid entanglement or contact between robotic arm 102 and hose 307. For similar reasons, the vehicle can point a clamping structure (e.g., clamping structure 107-1) towards cap 301-1 of PR bottle 305-1 and clamp onto cap 301-1 on the outer sidewall. When clamps (e.g., 201-2 in FIG. 2A) of clamping structure 107-1 adjust to the size of cap 301-1 and tightly clamps onto the outer sidewall of cap 301-1, rotatable base 115-1 can drive rotatable stage 109-1 to turn, e.g., clockwise, so that the relative movement between cap 301-1 and PR bottle 305-1 can be counter-clockwise, and cap 301-1 can be taken off from PR bottle 305-1. Further, socket 301-2 can be taken off from PR bottle 305-2. In some embodiments, gripping structure 107 removes socket 301-2 when carrying the removed cap 301-1, as shown in FIG. 3B. In the present disclosure, it is assumed that clock-wise relative movement between the cap/socket and the PR bottle can fix/couple the cap/socket onto the PR bottle and counter clock-wise relative movement between the cap/socket and the PR bottle can remove the cap/socket from the PR bottle.

Further, robotic arm 102 can lift socket 301-2, cap 301-1, and hose 307 to avoid contact between hose 307 and PR bottles (e.g., 305-1 and 305-2), and place hose 307 into PR bottle 305-1. After hose 307 is properly placed in PR bottle 305-1, rotatable base 115-1 can first drive rotatable stage 109-1 to rotate clockwise so that the relative movement between socket 301-2 and PR bottle 305-1 is counter-clockwise, allowing socket 301-2 to match to the thread of PR bottle 305-1. After socket 301-2 matches to the thread of PR bottle 305-1, rotatable base 115-1 can drive rotatable stage 109-1 to rotate counter-clockwise, so that the relative movement between socket 301-2 and PR bottle 305-1 is clockwise, allowing socket 301-2 to screw into the thread of PR bottle 305-1. Clamping structure 107-1 can continue to screw socket 301-2 and fix/couple socket 301-2 onto PR bottle 305-1. Meanwhile, rotatable base 115-1 can keep rotating counter-clockwise to allow socket 301-2 to tightly fix/couple onto PR bottle 305-1. Optionally, after socket 301-2 is screwed onto PR bottle 305-1, clamps of clamping structure 107-1 can move laterally (e.g., along the y1-axis in FIGS. 2A and 2B) to release socket 301-2. Optionally, after releasing socket 301-2, robotic arm 102 can rotate gripping portion 107 and move clamping structure 107-1 and cap 301-1 towards PR bottle 305-2. Robotic arm 102 can further screw cap 301-1 onto PR bottle 305-2. The operation process to screw cap 301-1 onto PR bottle 305-2 can be similar to the operation of socket 301-2 and is not repeated herein.

The cap/socket replacement operation can be controlled by the central controller (e.g., central controller 130 in FIG. 1) and/or the vehicle, and executed by different parts of the vehicle. For example, when the vehicle detects two matching PR bottles (e.g., 305-1 and 305-2) are placed properly on the rotatable stages (e.g., 109-1 and 109-2), the control unit of the vehicle can control robotic arm 102 to remove cap 301-1 of PR bottle 305-1 and socket 301-2 of PR bottle 305-2. The control unit can monitor the operation through imaging device 110. In an example, the control unit can monitor the cap/socket replacement through imaging device 110 by monitoring the position of weight 310. In some embodiments, imaging device 110 records and transmits the real-time images of weight 310 to the control unit and/or the central controller, and the control unit and/or the central controller can perform an image recognition process to determine whether weight 310 is taken out of PR bottle 305-2, contacting PR bottles 305-1 and 305-2, or placed in PR bottle 305-1. That is, the position of weight 310 is precisely monitored and controlled to ensure the cap/socket replacement process is performed properly. In some embodiments, weight 310 can touch the bottom of PR bottle 305-2 to be considered being properly placed. In some embodiments, imaging device 110 includes a dual CCD camera, and the control unit and/or the central controller cross match the images of weight 310 along the x-axis, the y-axis, and/or the z-axis to determine the position of weight 310 (e.g., a 3D positioning method).

Further, during the cap/socket replacement process, the control unit and/or the central controller can perform torque control when clamping structures (e.g., 107-1 and 107-2) are turning the cap/socket. The timing and magnitude of the torque, and the direction of the twist applied on rotatable bases (e.g., 115-1 and 115-2) can be determined and controlled by the control unit and/or the central controller. In some embodiments, some parameters are predetermined and stored in the control unit and/or the central controller to enable the operation process to be more predictable/controllable. For example, the distance between the PR bottles (e.g., 305-1 and 305-2), the orientations of the PR bottles, and the dimensions of the containers (e.g., 302-1 and 302-2) can be predetermined and stored in the control unit and/or the central controller. Thus, the control unit and/or the central controller can more precisely control and monitor the placement and movements of parts during the operation.

Further, after the cap/socket replacement process is completed, the vehicle can unload container 302-2 and PR bottle 305-2 and/or the vehicle can transmit a status update (e.g., including the completion of cap/socket replacement, the time, and the ID numbers of the containers) to the central controller. The central controller can also transmit a notification (e.g., including the status update) to one or more receiving devices. The central controller can further transmit the location of the vehicle's next destination to the control unit or the vehicle can automatically return to the first location. The vehicle can transport container 302-1 and PR bottle 305-1 to the designated location and unload container 302-1 and PR bottle 305-1 at the location.

For illustrative purposes, two containers/PR bottles are shown to describe the operation. In some embodiments, more than two containers/PR bottles can be loaded onto the vehicle for cap/socket replacement. In some embodiments, the vehicle can transport to different locations to load more than two containers/PR bottles. In some embodiments, the dimensions of containers/PR bottles vary. The difference in dimensions can be stored in the control unit and/or the central controller in the form of ID numbers. Thus, when containers/PR bottles of various dimensions are loaded onto the vehicle, the control unit and/or central controller can detect the differences through, e.g., ID sensing device 116. The movement of robotic arm 102 can be adjusted accordingly.

Figure 4:
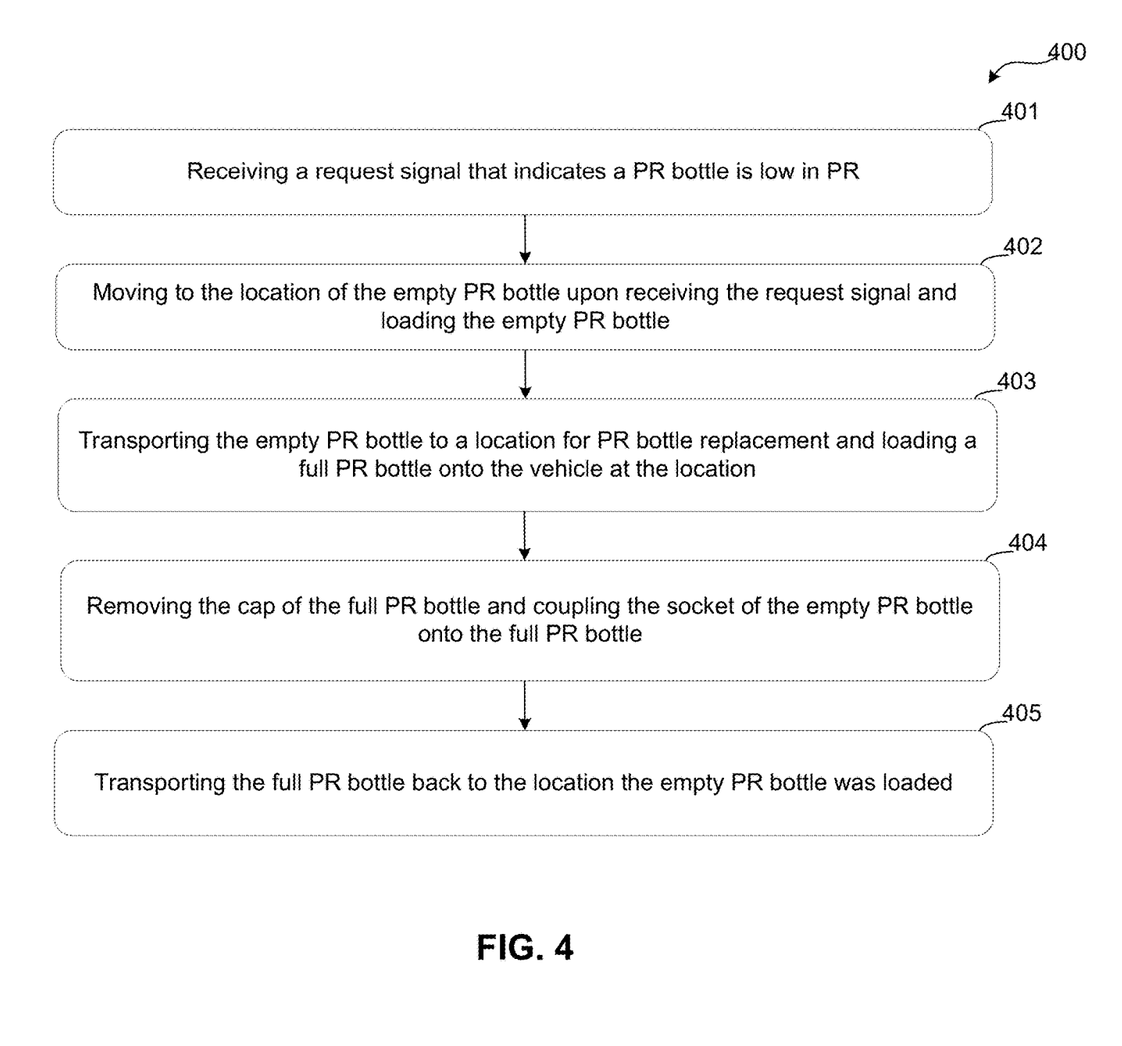
FIG. 4 illustrates an exemplary process flow of a PR replacement process, according to some embodiments.

FIG. 4 illustrates an exemplary PR bottle replacement method/process 400 using the system disclosed by the present disclosure, according to some embodiments. In some embodiments, operations of method 400 can be performed in a different order. Variations of method 400 are within the scope of the present disclosure.

In operation 401, a vehicle receives a request signal indicating a PR bottle is low in PR (e.g., an empty PR bottle). The vehicle can generate orders based on the request signal and control the operation of different parts of the vehicle based on the orders. In some embodiments, the request signal can be transmitted from the container that contains the PR bottle low in PR and/or from the receiving device that discovers the PR bottle low in PR. In some embodiments, the request signal is transmitted to the central controller, and the central controller can further transmit a command to a vehicle for PR bottle refill/replacement. The request signal can include detailed information of the empty PR bottle such as the location of the empty PR bottle (e.g., the first location), the time of the request, the ID number of the empty PR bottle, etc. In some embodiments, the ID number of a PR bottle is uniquely stored in system. The ID number can include any suitable label/code such as a string of numbers/characters, a RFID, a bar code, etc. The ID number can reflect the type of PR contained in the PR bottle, the dimensions of the PR bottle, etc. The ID number can be imprinted on the PR bottle and/or the container with the PR bottle. In some embodiments, the ID number can be scanned/read out by a corresponding scanner/reader such as a RFID reader, bar code reader, etc. Details of the system can be referred to the description of FIG. 1.

In operation 402, the vehicle moves to the location of the empty PR bottle upon receiving the request signal and loads the empty PR bottle onto the vehicle. In some embodiments, commands including the coordinates of the first location and the ID number of the empty PR bottle are transmitted to a vehicle. After receiving the commands, the vehicle can approach the first location by choosing a designated route according to the coordinates and an indoor map. In some embodiments, the central controller receives the request signal and commands (e.g., transmits instructions to) the vehicle to move to the location of the empty PR bottle. Details of the vehicle can be referred to the description of FIG. 1.

In operation 403, the vehicle transports the empty PR bottle to a location for PR bottle replacement and loads a full PR bottle onto the vehicle at this location. In some embodiments, after arriving at the first location, the empty PR bottle and its corresponding container can be loaded onto the vehicle manually (e.g., by a technician) or automatically (e.g., by the vehicle). The vehicle can verify the identification of the empty PR bottle by scanning the ID number on the container and/or on the empty PR bottle. In some embodiments, after loading the container and verifying the ID number of the PR bottle, the vehicle transports the empty PR bottle and its corresponding container to the second location (e.g., a warehouse) and a full PR bottle and its corresponding container is loaded onto the vehicle manually or automatically. Similarly, the vehicle can verify the identification of the full PR bottle by scanning the ID number on the container and/or on the full PR bottle. In some embodiments, the central controller commands (e.g., transmits instructions to) the vehicle to transport the empty PR bottle and load the full PR bottle. Details of the process can be referred to the description of FIGS. 3A and 3B.

In operation 404, the vehicle removes the cap of the full PR bottle and couples the socket of the empty PR bottle on the full PR bottle. In some embodiments, the vehicle rotates the rotatable stages that support and fix the PR bottles to facilitate the removal and replacement of the cap and the socket. In some embodiments, the cap of the full PR bottle is removed, and the socket (e.g., along with the hose and the weight) of the empty PR bottle is taken out from the empty PR bottle and placed into the full PR bottle. To avoid contact and entanglement with the hose, in some embodiments, the cap and the socket are clamped onto the outer sidewall. In some embodiments, the imaging device of the vehicle can be used to monitor the real-time placement of the socket by performing 3D positioning of the weight. After the socket, the hose, and the weight are properly placed onto the full PR bottle, the socket can be turned to be fixed onto the full PR bottle. In some embodiments, the status of the empty/full PR bottle in the system is updated. In some embodiments, the central controller commands (e.g., transmits instructions to) the vehicle to remove the cap of the full PR bottle and place the socket of the empty PR bottle on the full PR bottle. Details of the process can be referred to the description of FIGS. 3A and 3B.

In operation 405, the vehicle transports the full PR bottle back to the first location. After the replacement of the socket is completed, in some embodiments, the vehicle transports the full PR bottle to the first location where the empty PR bottle was loaded. The full PR bottle can then be unloaded manually or automatically. In some embodiments, the status of the empty/full PR bottle in the system is updated. In some embodiments, the central controller commands (e.g., transmits instructions to) the vehicle to transport the full PR bottle back to the first location. Details of the process can be referred to the description of FIGS. 3A and 3B.

By using the disclosed apparatus and method, the loading/unloading, transport, and replacement of empty PR bottles can be automated, and less labor is needed. The automated operation can reduce the number of PR bottles that are damaged during the replacement process, and the vehicle and the container can reduce the chances of PR bottle damages and leakage. The accuracy of the replacement process can also be improved. Further, it takes less time to replace the empty PR bottles. Thus, replacing empty PR bottles can be less costly.

Figure 5:
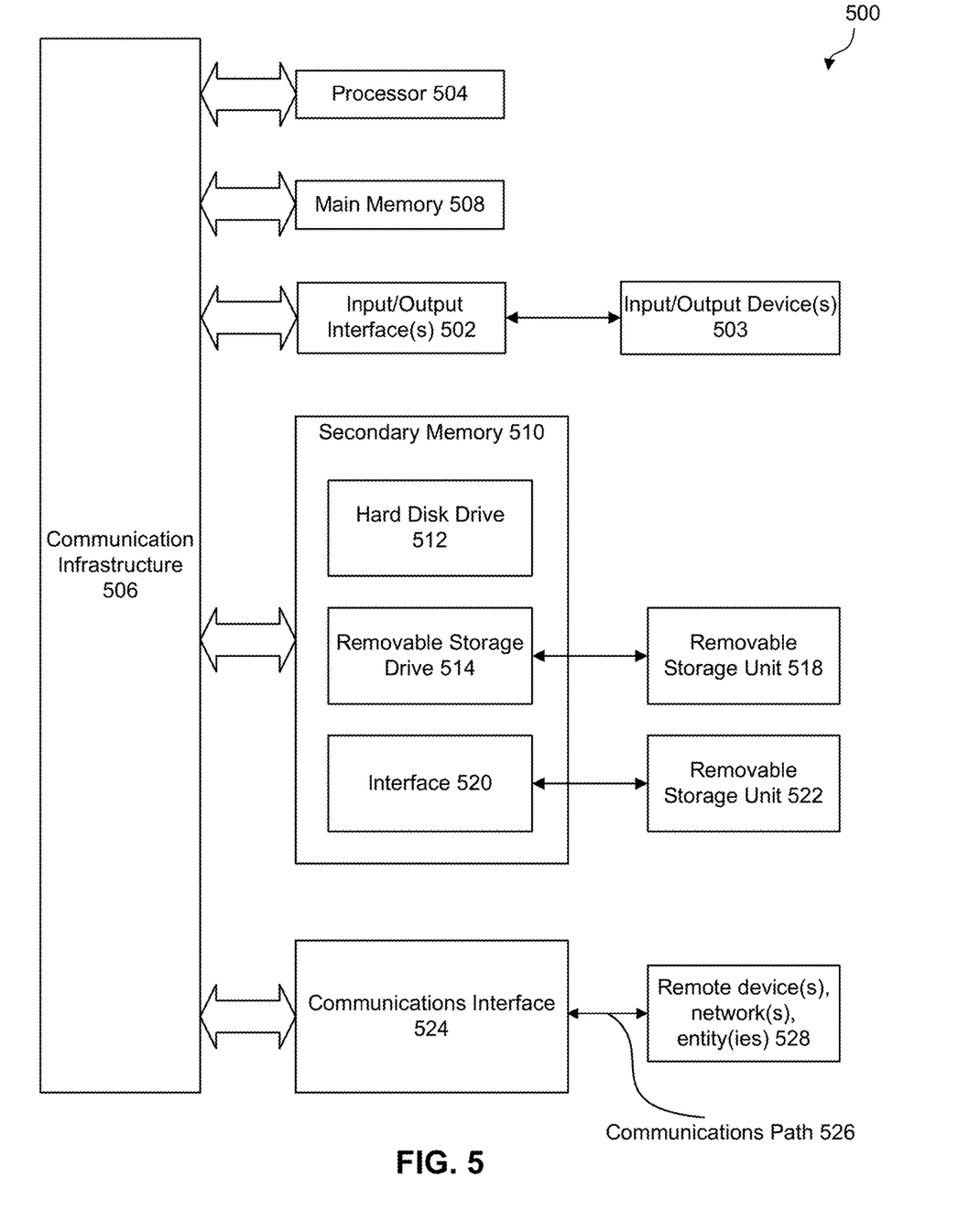
FIG. 5 is an illustration of an example computer system for implementing various embodiments.

FIG. 5 is an illustration of an example computer system 500 in which various embodiments of the present disclosure can be implemented, according to some embodiments. Computer system can be used in the control unit of the vehicle, the IC of the container, the receiving devices, and the central controller, as described above. Computer system 500 can be any well-known computer capable of performing the functions and operations described herein. For example, and without limitation, computer system 500 can be capable of processing and transmitting signals. Computer system 500 can be used, for example, to execute one or more functions of the vehicle, which describes example operations of communications amongst different parts of the vehicle and between the vehicle and the central controller.

Computer system 500 includes one or more processors (also called central processing units, or CPUs), such as a processor 504. Processor 504 is connected to a communication infrastructure or bus 506. Computer system 500 also includes input/output device(s) 503, such as monitors, keyboards, pointing devices, etc., that communicate with communication infrastructure or bus 506 through input/output interface(s) 502. Computer system 500 can receive instructions to implement functions and operations described herein—e.g., functions of the vehicle and method 400—via input/output device(s) 503. Computer system 500 also includes a main or primary memory 508, such as random access memory (RAM). Main memory 508 can include one or more levels of cache. Main memory 508 has stored therein control logic (e.g., computer software) and/or data. In some embodiments, the control logic (e.g., computer software) and/or data can include one or more of the functions described above with respect to the container.

Computer system 500 can also include one or more secondary storage devices or memory 510. Secondary memory 510 can include, for example, a hard disk drive 512 and/or a removable storage device or drive 514. Removable storage drive 514 can be a floppy disk drive, a magnetic tape drive, a compact disk drive, an optical storage device, tape backup device, and/or any other storage device/drive.

Removable storage drive 514 can interact with a removable storage unit 518. Removable storage unit 518 includes a computer usable or readable storage device having stored thereon computer software (control logic) and/or data. Removable storage unit 518 can be a floppy disk, magnetic tape, compact disk, DVD, optical storage disk, and/or any other computer data storage device. Removable storage drive 514 reads from and/or writes to removable storage unit 518 in a well-known manner.

According to some embodiments, secondary memory 510 can include other means, instrumentalities or other approaches for allowing computer programs and/or other instructions and/or data to be accessed by computer system 500. Such means, instrumentalities or other approaches can include, for example, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 510, removable storage unit 518, and/or removable storage unit 522 can include one or more of the functions described above with respect to the container.

Computer system 500 can further include a communication or network interface 524. Communication interface 524 enables computer system 500 to communicate and interact with any combination of remote devices, remote networks, remote entities, etc. (individually and collectively referenced by reference number 528). For example, communication interface 524 can allow computer system 500 to communicate with remote devices 528 over communications path 526, which can be wired and/or wireless, and which can include any combination of LANs, WANs, the Internet, etc. Control logic and/or data can be transmitted to and from computer system 500 via communication path 526.

The functions/operations in the preceding embodiments can be implemented in a wide variety of configurations and architectures. Therefore, some or all of the operations in the preceding embodiments—e.g., functions of the vehicle and the central controller, and method 400—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 500, main memory 508, secondary memory 510 and removable storage units 518 and 522, as well as tangible articles of manufacture embodying any combination of the foregoing. Such control logic, when executed by one or more data processing devices (such as computer system 500), causes such data processing devices to operate as described herein. In some embodiments, computer system 500 includes hardware/equipment for the manufacturing of photomasks and circuit fabrication. For example, the hardware/equipment can be connected to or be part of element 528 (remote device(s), network(s), entity(ies) 528) of computer system 500.

Embodiments of the present disclosure describe a system and a method to automatically transport PR bottles and replace an empty PR bottle with a filled PR bottle. The system includes a central controller, a vehicle, and a plurality of receiving devices. The central controller communicates with and controls the operation of the vehicle and the receiving devices. The vehicle, being controlled by the central controller, can automatically transport an empty PR bottle from a fabrication location to a location for PR bottle replacement (e.g., warehouse), replace the cap of a full PR bottle with the socket of the empty PR bottle, and transport the full PR bottle back to the fabrication location. A benefit, among others, includes that the transport and replacement/refill of PR bottles can be automated so that the transport and replacement/refill of PR bottles are less susceptible to uncertainties/errors caused by human operations. Being protected by a container and transported by the vehicle, the PR bottles are less susceptible to damage/spill/leakage, and the transport can be less time-consuming. Further, the PR bottles can be loaded and unloaded to the vehicle using automated means with improved stability, reducing the chances of PR bottle damages/spill/leakage. Further, the socket replacement process is more reliable and predictable by using a robotic arm. Less labor is thus needed for the loading, transport, and replacement of PR bottles.

In some embodiments, a method for replacing a PR bottle using a vehicle is provided. The method includes receiving a request signal for replacing a first PR bottle. The request signal includes a first location associated with the first PR bottle. The method also includes moving to the first location, loading the first PR bottle, transporting the first PR bottle to a second location associated with a second PR bottle, and loading the second PR bottle. The method further includes removing a cap from the second PR bottle and a socket from the first PR bottle, coupling the socket of the first PR bottle to the second PR bottle, and transporting the second PR bottle to the first location.

In some embodiments, a vehicle provided by the present disclosure includes a processor configured to receive a request signal to replace a first PR bottle. The request signal includes a first location associated with the first PR bottle. The processor is also configured to transmit an order based on the request signal. The vehicle also includes a plurality of wheels configured to move the vehicle from the first location to a second location, and from the second location to the first location. The vehicle further includes a robotic arm configured to load, at the first location, the first PR bottle into a first container, load, at the second location, a second PR bottle in a second container, remove a cap from the second PR bottle and a socket from the first PR bottle, couple the socket of the first PR bottle to the second PR bottle, and unload, at the first location, the second PR bottle from the second container.

In some embodiments, a computer system for replacing a PR bottle includes a memory configured to store a program and data for replacing the PR bottle and a processor configured to receive a request signal for replacing a first PR bottle. The request signal includes a first location associated with a first PR bottle. The processor is further configured to send a vehicle to the first location and control the vehicle to load the first PR bottle onto the vehicle, transport the first PR bottle to a second location where a second PR bottle is located, and load the second PR bottle onto the vehicle. The processor is further configured to remove a cap of the second PR bottle and a socket of the first PR bottle, couple the socket of the first PR bottle onto the second PR bottle, and transport the second PR bottle to the first location.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method to control a vehicle to replace a photoresist (PR) bottle, comprising:
   receiving a request signal based on a usage condition of the PR bottle;
   relocating, via the vehicle, the PR bottle from a first location to a second location based on the request signal;
   replacing, via a robotic arm on the vehicle, a cap on an other PR bottle by a socket on the PR bottle; and
   transporting the other PR bottle from the second location to the first location.

2. The method of claim 1, wherein receiving the request signal comprises accepting a wireless signal from a container that contains the PR bottle.

3. The method of claim 1, wherein receiving the request signal comprises accepting a wireless signal that provides the first location.

4. The method of claim 1, wherein receiving the request signal comprises accepting a wireless signal that provides a time stamp.

5. The method of claim 1, wherein relocating the PR bottle comprises:
   generating a coordinate of the first location based on the request signal; and
   determining a route to the first location based on the coordinate.

6. The method of claim 1, wherein transporting the other PR bottle comprises:
   loading, via the robotic arm of the vehicle, the other PR bottle on the vehicle; and
   moving the vehicle, in an autonomous mode, from the second location to the first location based on instructions from a central controller of the vehicle.

7. The method of claim 1, wherein replacing the cap on the other PR bottle comprises:
   unscrewing the socket from the PR bottle;
   removing the cap from the other PR bottle; and
   coupling the socket onto the other PR bottle.

8. A method, comprising:
   receiving a request signal indicating that a first photoresist (PR) bottle at a first location needs to be replaced;
   moving a vehicle to the first location;
   loading the first PR bottle onto the vehicle;
   transporting the first PR bottle to a second location where a second PR bottle is stored;
   loading the second PR bottle onto the vehicle;
   removing a socket from the first PR bottle;
   coupling the socket onto the second PR bottle; and
   transporting the second PR bottle to the first location.

9. The method of claim 8, wherein:
   loading the first PR bottle onto the vehicle comprises fixing the first PR bottle onto a first rotatable stage of the vehicle; and
   loading the second PR bottle onto the vehicle comprises fixing the second PR bottle onto a second rotatable stage of the vehicle.

10. The method of claim 9, wherein:
    removing the socket from the first PR bottle comprises rotating the first rotatable stage along a first direction; and
    coupling the socket onto the second PR bottle comprises rotating the second rotatable stage along a second direction different from the first direction.

11. The method of claim 8, wherein removing the socket from the first PR bottle comprises:
    clamping the socket via a clamping structure of the vehicle; and
    unscrewing the socket from the first PR bottle.

12. The method of claim 8, wherein coupling the socket onto the second PR bottle comprises monitoring a position of the socket based on a real-time position of a weight attached to a hose inserted through the socket.

13. The method of claim 8, further comprising determining, based on a map, first and second routes to the first and second locations, respectively.

14. The method of claim 8, wherein loading the first and second PR bottles onto the vehicle comprises verifying first and second identifications of the first and second PR bottles, respectively.

15. A method, comprising:
    loading, at a first location, a first photoresist (PR) bottle onto a first rotatable stage of a vehicle;
    loading, at a second location, a second PR bottle onto a second rotatable stage of the vehicle;
    clamping, by a clamping structure, a socket on the first PR bottle, wherein the clamping structure is on a robotic arm of the vehicle;
    rotating the first rotatable stage to unscrew the socket from the first PR bottle;
    coupling the socket onto the second PR bottle; and
    unloading, at the first location, the second PR bottle.

16. The method of claim 15, further comprising identifying ID numbers of first and second containers securing the first and second PR bottles, respectively.

17. The method of claim 15, wherein coupling the socket onto the second PR bottle comprises placing a hose, inserted through the socket, in the second PR bottle.

18. The method of claim 15, wherein loading the first PR bottle comprises:
  lifting, via the robotic arm, a first container securing the first PR bottle; and
  loading, via the robotic arm, the first container onto the first rotatable stage of the vehicle.

19. The method of claim 15, further comprising updating a first status of the first PR bottle and a second status of the second PR bottle.

20. The method of claim 15, further comprising removing a cap of the second PR bottle.

* * * * *